United States Patent
Ahrens et al.

(10) Patent No.: US 7,176,128 B2
(45) Date of Patent: Feb. 13, 2007

(54) METHOD FOR FABRICATION OF A CONTACT STRUCTURE

(75) Inventors: Carsten Ahrens, Munich (DE); Jakob Huber, Beyharting (DE); Uwe Seidel, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/755,844

(22) Filed: Jan. 12, 2004

(65) Prior Publication Data

US 2005/0153546 A1 Jul. 14, 2005

(51) Int. Cl.
*H01L 21/4763* (2006.01)

(52) U.S. Cl. ....................................................... 438/643

(58) Field of Classification Search ................ 438/626, 438/631, 639, 642, 643, 644, 645, 648, 687, 438/627, 628
See application file for complete search history.

(56) References Cited

U.S. PATENT DOCUMENTS

| | | |
|---|---|---|
| 5,608,264 A | 3/1997 | Gaul |
| 5,618,752 A | 4/1997 | Gaul |
| 5,767,001 A * | 6/1998 | Bertagnolli et al. ........ 438/455 |
| 6,348,731 B1 | 2/2002 | Ashley et al. |
| 2001/0054769 A1 | 12/2001 | Raaijmakers et al. |
| 2002/0063311 A1 * | 5/2002 | Siniaguine ................... 257/621 |
| 2002/0084513 A1 * | 7/2002 | Siniaguine ................... 257/621 |
| 2002/0127868 A1 * | 9/2002 | Siniaguine ................... 438/752 |
| 2002/0163072 A1 | 11/2002 | Gupta et al. |
| 2003/0215984 A1 | 11/2003 | Pogge et al. |
| 2004/0253809 A1 * | 12/2004 | Yao et al. ..................... 438/631 |

FOREIGN PATENT DOCUMENTS

| | | |
|---|---|---|
| DE | 19816245 | 10/1999 |
| EP | 1094504 A2 | 4/2001 |
| EP | 1391924 A1 | 2/2004 |
| FR | 2816758 | 5/2002 |
| JP | 2002190477 | 7/2002 |
| WO | WO 03/079431 A | 9/2003 |

OTHER PUBLICATIONS

Burkett et al., "Processing Techniques for 3-D Integration Techniques", Superficies y Vacio 13, 1-6, Dec. 2001. (6 pages).

* cited by examiner

*Primary Examiner*—Lex H. Malsawma
(74) *Attorney, Agent, or Firm*—Maginot, Moore & Beck

(57) ABSTRACT

A method for producing a contact structure on a structured surface comprising producing a first conductive layer on the structured surface, wherein the first conductive layer comprising tungsten. A conductive seed layer is produced on the first conductive layer, the contact structure being produced by electroplating on the seed layer. The first conductive layer serves as an etch stop for selectively removing substrate material from the backside.

23 Claims, 8 Drawing Sheets

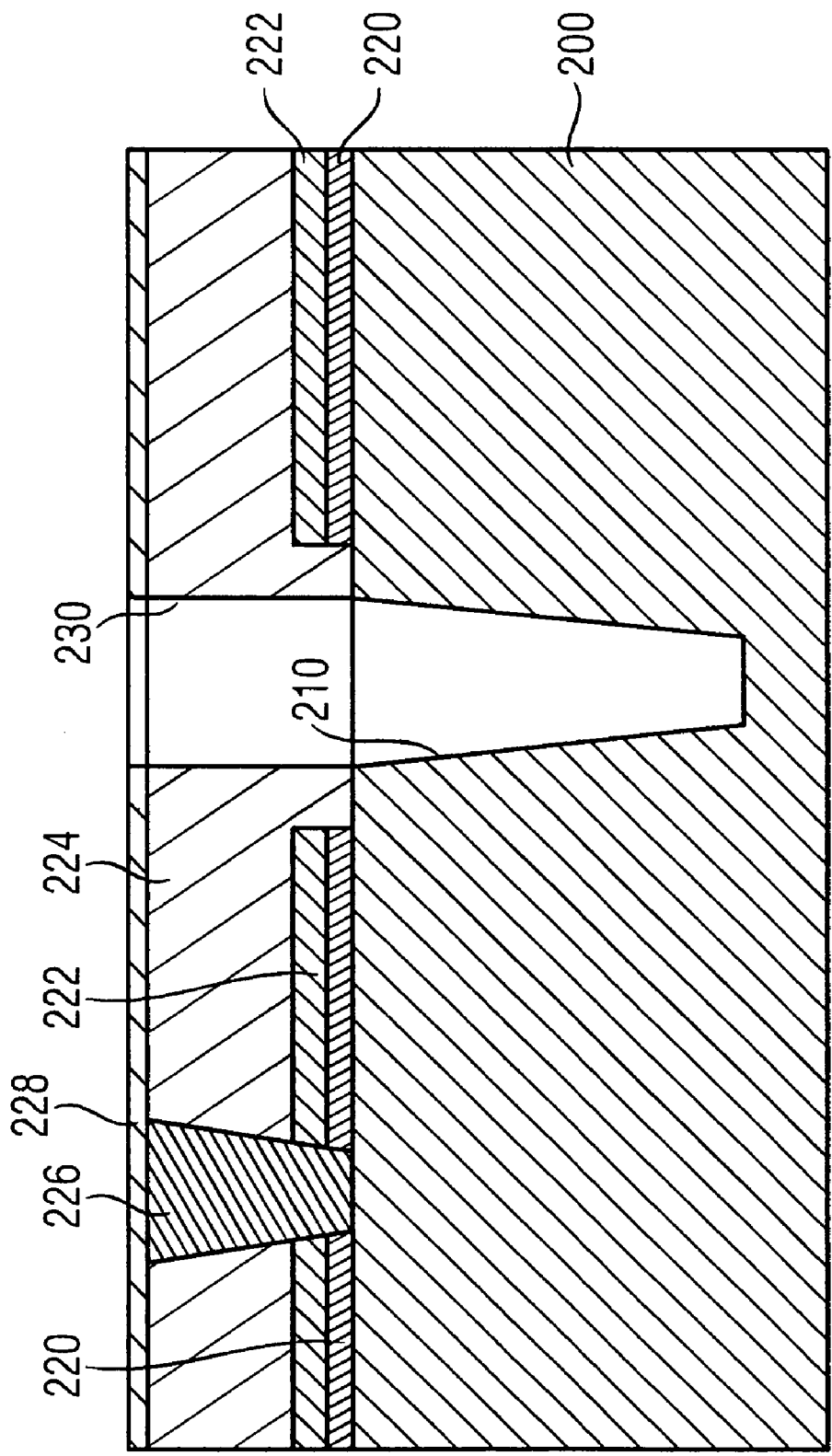

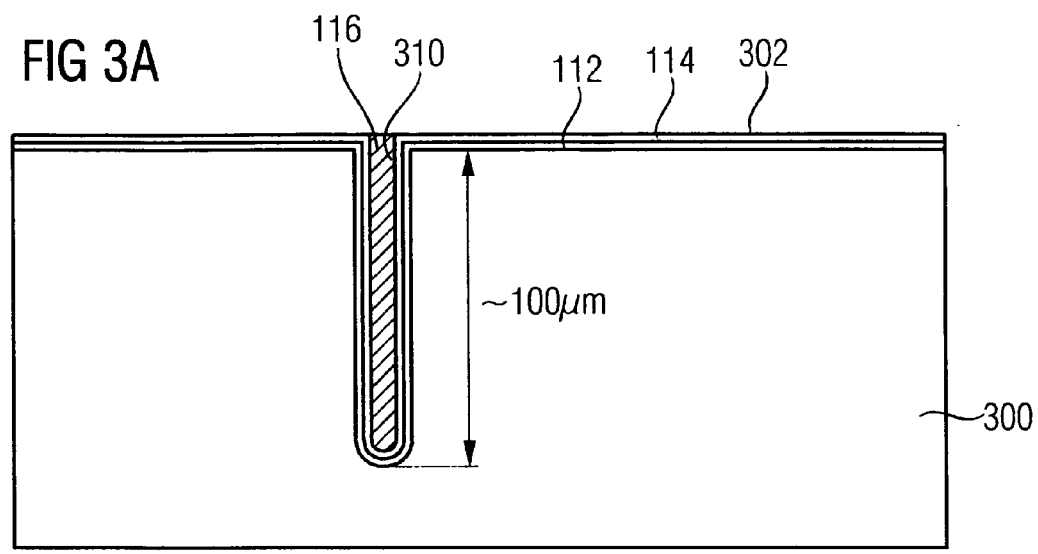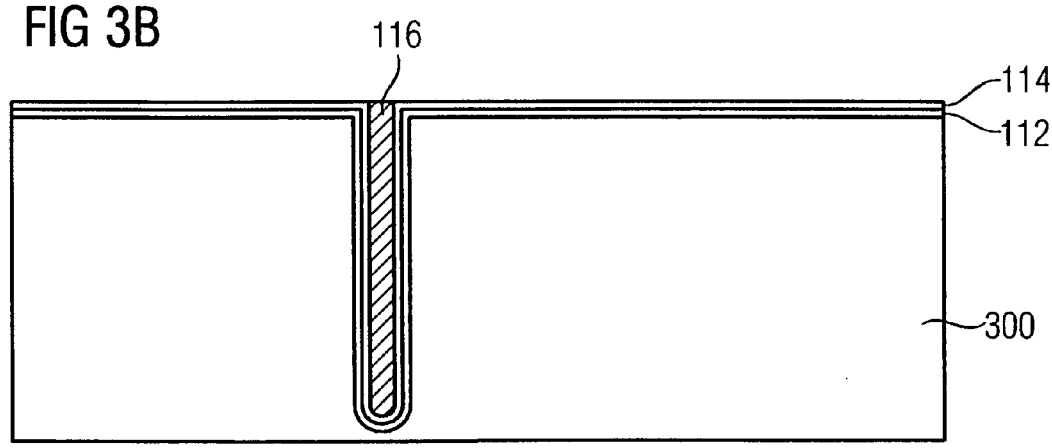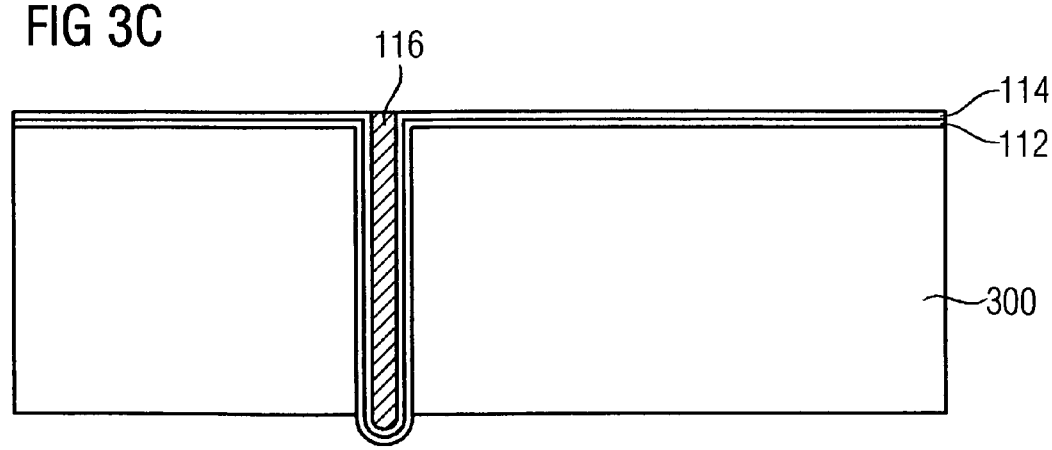

METHOD FOR FABRICATION OF A CONTACT STRUCTURE

BACKGROUND OF THE INVENTION

1. Field of the Invention

The present invention relates to the production of contact structures on a structured surface of a substrate.

2. Description of Related Art

In many fields there are considerable challenges to producing contact structures due to the increasing demands placed on them in terms of quality and size. Especially for semiconductor substrates, problems concerning electrical contact arise due to the strong increase in electronic performance requirements. As the frequency range above 1 GHz is being opened up increasingly for semiconductor applications, the need to optimize the contact of the active components to the RF ground becomes more marked. Hitherto, in Si components, the mass potentials have been bonded from the front of the chips to the ground contacts of the package via bond wires. Such a bond wire has an inductance of typically 0.5 nH, depending on the length. This corresponds to an impedance of 3 Ohm at 1 GHz. An impedance of this magnitude being present in the emitter and/or source path of an RF amplifier circuit greatly reduces the gain available. Gain losses of 10 dB are not unusual. Even though multiple bonds are of assistance to a certain degree, they still do not, in principle, provide a solution.

In GaAs technology, it has therefore been common practice for a long time to lead the source contacts from the back of the semiconductor chip to the front by means of a metallic via. In silicon technology, a number of process related difficulties, in particular the low etching rates of silicon, have prevented an introduction of such substrate via contacts.

An alternative solution would be a flip-chip technology with metal bumps on the contacts. This technology, however, has the disadvantage of a relatively poor heat dissipation. With small components, such as discrete transistors and MMICs (MMIC=monolithic microwave IC), an added disadvantage is that a larger die size of silicon is required because of the bumps, and that, at least up to now, no flip-chip bonding process exists that would even so much as get close to the cycle times of "upright" die-bonding.

It has been known in the art to create vias wherein a reverse-side photolithography process and further reverse-side process steps are required, which is an extremely difficult task to perform on thin wafers. Such a method has been described, for example, in DE 19816245. On the other hand, it is necessary, for a variety of reasons, to thin the silicon wafers typically to about 50–200 μm, so that for this reason and also because of the enormously long process times, a via on thick wafers is of little use.

In addition, U.S. Pat. Nos. 5,618,752 and 5,608,264 contain descriptions of forming an opening in a silicon substrate, wherein the opening is filled with a metal after depositing a barrier metal layer and an oxide layer. In the above-described patent applications and according to the current state of the art, however, it is practically impossible to fully fill Via holes, which have dimensions of a very high aspect ratio of 1:10, to the required depth using conventional metal coating methods. Therefore it is assumed, in the above patent applications, that after the metal deposition effected by sputtering, evaporation or a CVD process, a residual opening remains, which must be filled up with further filling material. The details disclosed in the above patent applications therefore are not sufficient so as to be able to advantageously produce substrate vias. In addition, the above patent applications do not indicate any practical method specifying how the substrate vias may be exposed and connected in a convenient manner from the reverse side once the front side of the wafers has been completed.

It is also known in the art to produce contacts by means of electroplating. Since the introduction of copper metalization into semiconductor technology, processes based on electroplating have been available which are suitable, in principle, for filling very large via openings.

A precondition for electroplating is a conductive layer which is referred to as a seed layer and typically also includes copper. The seed layer is applied by means of PVD (physical vapor deposition) methods. CVD and electroplating techniques are also possible. The copper seed layer is deposited onto a tantalum diffusion barrier and/or tantalum-based diffusion barrier commonly used for this method, wherein, as is known, PVD deposition is used, but other methods are also possible. Other barrier materials, such as CVD-TiN or electroplated barriers may be applied.

For deep vias having a high aspect ratio, typically 1:10, no reliable and sufficient area coverage of the via-opening sidewall and of the via bottom can be achieved using the usual PVD methods. Literature frequently gives descriptions of the use of Cu-CVD methods for producing the Cu seed layer, for example in the following publication: "Wafer Process and Issue of Through Electrodes in Si Wafer Using Cu Damascene for Three Dimensional Chip Stacking", Masataka Hoshino et al., Superficies y Vacio 13, 1–6, Diciembre 2001, and the publication: "Processing Techniques for 3-FD Integration Techniques", S. Burkett et al., Superficies y Vacio 13, 1–6, Diciembre 2001. The above-described Cu-CVD methods have been applied for years in research laboratories, but have not been introduced in semiconductor production. In addition, manufacturers of electrolytes have developed electrolytes which permit electrolytic copper deposition on a barrier, which is also known by the name of high-resistance electrolyte.

In summary, it can be stated that the prior art knows of no technique that would enable the creation of contacts on structured surfaces that would meet the requirements placed upon them by modern technologies, and, in particular, by semiconductor technology.

SUMMARY OF THE INVENTION

It is the objective of the present invention to provide an improved method for producing contact structures.

The present invention is a method for producing a contact structure on a structured surface of a substrate, the method comprising producing a first conductive layer on the structured surface, the first conductive layer comprising tungsten, producing a conductive seed layer on the first layer and electroplating the contact structure on the seed layer.

The present invention is based on the findings that by producing the seed layer on a layer which comprises tungsten (W), a high-quality contact structure may be deposited in a subsequent electroplating step. The layer comprising tungsten, also referred to as W layer hereinafter, exhibits excellent edge coverage, which is why the requirements for the seed layer are considerably reduced. In addition, the W layer may be formed with a high degree of homogeneity. The high degree of edge coverage is achieved by using tungsten, the inventive layer preferably having a layer being completely formed of tungsten, or a layer having a tungsten alloy with preferably at least 10% by weight of tungsten. The favorable edge coverage enables, in particular, the use of structures with abrupt junctions or edges, wherein uniform and high-quality electroplating may still be achieved due to the excellent edge coverage.

The favorable edge coverage of the layer also enables closed coating even of deep openings in a substrate having an electrically conductive layer. The layer comprising tungsten may be used as a current-carrying layer in electroplating, whereby the demands placed upon the seed layer are kept small In particular, the seed layer may have a very small thickness, even traces of copper deposited onto the layer comprising tungsten being sufficient for enabling high-quality electroplating. In particular, due to the high degree of homogeneity and high quality of the layer comprising tungsten, a homogeneous current supply is possible in electroplating, which has advantageous effects on the production of the contact structure which may be produced with a high degree of uniformity and small-scale mechanical interferences. The use of the inventive W layer, which takes on the property of a conducting layer, which is required for electrolytical copper deposition, disposes with the need to have to achieve, with a sputtered copper layer, a conductive connection to the interior of the substrate via.

The inventive method is particularly advantageous for producing electrical contacts on structured surfaces of semiconductor substrates, and, in particular, of silicon substrates for current and future requirements associated with semiconductor technology. In particular, the inventive method enables, in such applications, a complete filling-up of a deep opening or a deep via hole in a semiconductor substrate, the via hole having a high aspect ratio, for example 1:10, for producing electrical vias meeting the high demands placed upon them by semiconductor technology. The aspect ratios with which complete advantageous filling is possible is higher than 1:4. In terms of length dimensions, the inventive method permits a filling of openings with lateral dimensions <50 μm or via holes with a depth of >20 μm.

The first conductive layer may preferably have a thickness in the range from 0.1 μm to 1 μm most preferably 0.4 μm. A thickness of the first conductive layer below 0.1 μm is disadvantageous because of the increase of the electrical resistance for applying electrical currents. Furthermore, a thickness below 0.1 μm is disadvantageous in embodiments wherein the first conductive layer is used as a stop layer in a selective removal process, for example selective etching or CMP, because the thickness of the first conductive layer is not sufficient to provide a secure stopping of the removal process. The seed layer may have a small thickness of only a few nanometers, preferably in the range from one Mono layer to 10 nm at the position where the seed layer has the smallest thickness. However, it is also possible to form the seed layer with a thickness up to 5 μm. A thickness of the seed layer greater than 5 μm has the drawback that the edge covering is decreased, the resulting electrical contact structure produced by using such a seed layer having decreased electrical and mechanical properties.

In particular, the method is also suitable for electrically contacting other contact areas or metalizations in the substrate.

The layer comprising tungsten is preferably produced by means of a CVD process, which has the advantage that process steps which would be newly developed may be dispensed with, since in semiconductor technology, a W-CVD process has been used in manufacturing for years. Thereby, an integration into existing semiconductor processes is achieved without major reorganizations, whereby manufacturing costs are kept low, on the one hand, and a fast market introduction is achieved, on the other hand. In addition, the use of a W-CVD deposition for producing the inventive layer is most suitable, due to the very favorable edge and bottom coverage that may be achieved therewith, for a closed coating of deep substrate via openings with an electrically conductive layer.

When applied to silicon semiconductor technology, the inventive method therefore enables the manufacturing of metallic vias from the front side of a silicon wafer to the reverse side in a method suitable for production which may be integrated into a standard IC process and meets the high demands placed with regard to a homogeneous and complete filling of the via opening, good adhesion of the contact on the surface of the via opening with high aspect ratios and large depths.

In the inventive method, one or several barrier layers may preferably be provided. For example, the inventive W layer may comprise a stack of layers, wherein one or several barrier layers are formed in addition to a layer of W or a W alloy. The barrier layers may be metallic layers. The barrier layers may be, for example, Ti, titanium-based layers, e.g. TiN, Ta, or tantalum-based layers, e.g. TaN. Preferably, a layer stack of Ti and/or TiN is used in the stack between the layer of tungsten or tungsten alloy and the structured surface on which the contact is to be produced, so that a stack of Ti/TiN/W is formed, since the use of Ti and/or Ti-nitride is highly suitable as a barrier. For isolating the metal layers from the substrate, the substrate via opening may, in addition, previously also be coated with a dielectric material, so that the layer stack additionally includes a dielectric layer. Moreover, in addition to a metallic barrier layer formed between the structured surface and the W layer, one or several further barrier layers may be disposed between the layer of tungsten or tungsten alloy and the starting layer for electroplating. In other words, the seed layer deposited onto the W layer may include a layer stack wherein one or several further barrier layers are provided in addition to the starting layer for electroplating. The barrier layer arranged between the starting layer for electroplating and the W layer is preferably selected as a function of the material of the starting layer for electroplating. Preferably, the starting layer for electroplating comprises that material which is present in the electrolyte and which is deposited during the electroplating. Here, the material particularly preferred is copper. When using a starting layer made of copper, the barrier layers provided between the starting layers and the W layer preferably comprise Ta- or tantalum-based materials, since these are particularly well-suited, with Cu, for avoiding a diffusion.

However, other materials than the material deposited during the electroplating may also be used as a starting layer for electroplating, as long as the materials meet the requirements of a high degree of adhesion of the deposited material on the starting layer.

The use of multiple-layer structures has the added advantage that in the event of a planarization, the barrier layers located in the multiple-layer structure may be used as a stop layer when selectively removing the electrolytically deposited contact structure. For example, the stack of barrier layers provided between the W layer and the electroplating starting layer may be used as a polishing stop, so that underlying layers stemming from previous manufacturing steps are protected against uncontrolled polishing. The layer stack or remainders thereof may, in addition, be selectively removed itself, or themselves, which may be achieved, for example, by providing a high selectivity of the removal rates of tungsten versus copper. This has the advantage that additional auxiliary layers, such as silicon nitride, may be dispensed with, so that the manufacturing process is simplified and the manufacturing costs are low. Alternatively, masked electroplating for example masked copper electroplating, including merely a copper deposition in the substrate via, would also be possible. Preferably, however, masked electroplating, which is very expensive, may be dispensed with in the inventive method, so that the manufacturing expenditure and cost are considerably smaller in comparison with known electroplating methods.

In addition, the inventive method may be advantageously used, in particular, for the production of vias in a substrate. Here, too, the use of the inventive W layer proves advantageous, since the tungsten layer acts as an etch stop in a reverse-side etching, for example in wet chemical damage etching. Likewise, if one or several barrier layers are provided, the tungsten and/or the barrier layers may act as an etch stop. Thereby, the metalized vias may project out from the surface as pins after the selective etching, so that these pins may be planarized using a standard CMP step. A further advantage here is that with the use of suitable fillings, for example a copper filling, the W layer can be worn away at about the same rate, as the copper filling. The process stops on the planar silicon surfaces, so that etchings occur neither in the tungsten material nor in the copper. The above described method thus enables, in a simple manner, that the chemical-mechanical polishing step is performed over a small depth, so that a high quality of the planarized surface, with minor contaminations of the contact, may be achieved. Thereby, a reverse-side planarizing of vias may be achieved in a simple and low-cost manner, which planarization enables the vias to be electrically connected by means of a deposited metalization without contact problems, since the contact areas lie absolutely flat in the surface.

With the above-described creation of vias, the production of 3 D stacks may thus be advantageously achieved by superimposing several substrates having vias such that the vias of the respective superimposed substrates are electrically connected. To this end, for example, metallic bumps may be produced on the deposited metalizations so as to achieve electric contact between the stacks disposed one on the other. In the present invention, electroplating is preferably a deposition of a solid material from a liquid electrolyte by supplying electrical direct current flowing from an electrode in the electrolyte via the electrolyte and into the seed layer also known as galvanic deposition.

BRIEF DESCRIPTION OF THE DRAWINGS

These and other features of the present invention will become clear from the following description of taken in conjunction with the accompanying drawing, in which

FIG. 2a–d are diagrammatic cross-sections through a substrate, which depict the process steps in accordance with another embodiment of the present invention;

FIG. 3a–e are diagrammatic cross-sections through a substrate, which depict a production of vias in accordance with an embodiment of the present invention;

DESCRIPTION OF PREFERRED EMBODIMENTS

A first fundamental embodiment of the present invention will be explained below with reference to FIG. 1a–d. In accordance with FIG. 1a, a structured surface 100a is formed in a substrate 100, which surface 100a may be, for example, a surface of a recess or opening 110 in the substrate 100, which opening is filled with an electrically conductive contact. Even though, in the preferred embodiments, a description is merely given of a production of contacts in via holes of a substrate, the present invention is not limited to such structures but may include, for example, the production of a conductive contact on a projection or on other structured surfaces. Substrate 100 may include any known substrate. Preferably, the present invention is particularly suited for producing contacts in a semiconductor substrate, and, as is particularly preferred, in a silicon semiconductor substrate. Substrate 100 may be integrally formed or may include a multi-layer structure with various layer materials.

Figure 1A:
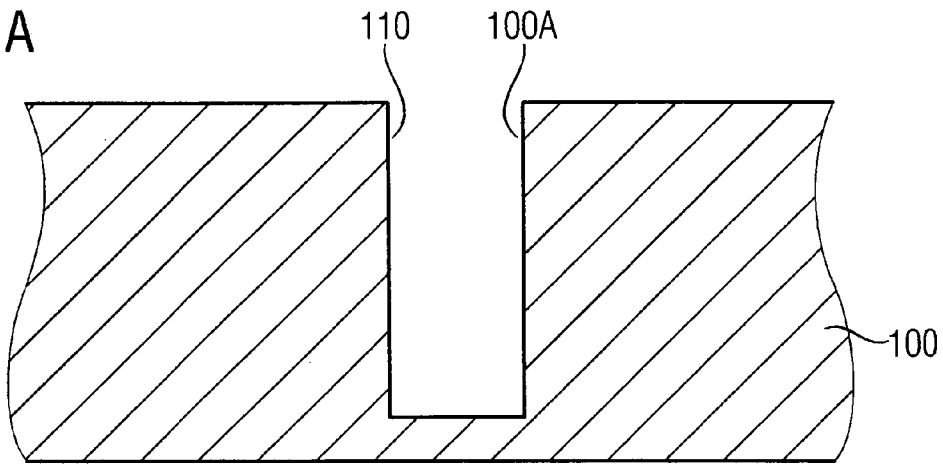
FIG. 1a–d are diagrammatic cross-sections through a substrate, which depict the process steps in accordance with an embodiment of the present invention.
Figure 1B:
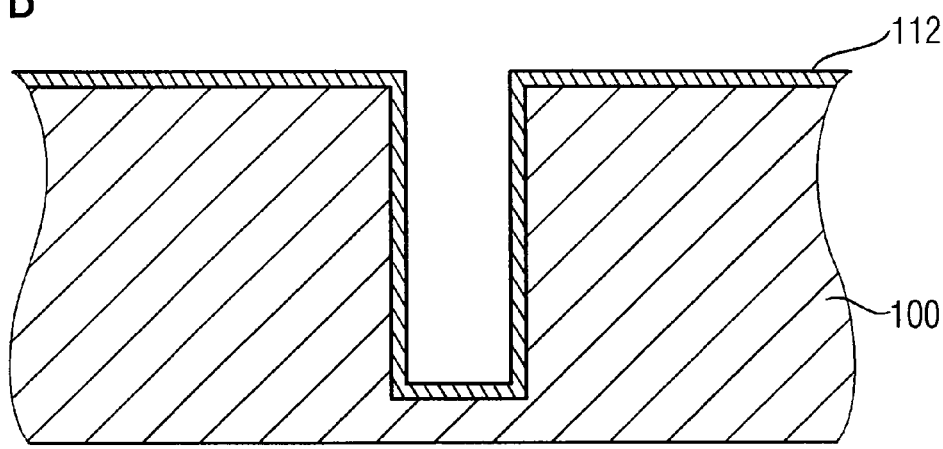

In accordance with the invention and with reference to FIG. 1b, a first conductive layer, comprising tungsten, is produced on the structured surface 100a. The first conductive layer may comprise only tungsten as its material, or it may comprise tungsten with additional alloy components. In addition, the first conductive layer may include a multi-layer structure, wherein only one layer comprises tungsten, whereas other layers comprise an insulating material, e.g. silicon oxide, and/or one or several layers with barrier material. The barrier material may include, for example, Ti, Ta, TiN, TaN. The first conductive layer is preferably formed by means of a CVD method (chemical vapor deposition), whereby an extremely good surface and edge coverage is achieved. As has already been explained, the use of tungsten has the advantage that a particularly good surface and edge coverage with small gaps is achieved, so that the layer comprising tungsten is formed homogeneously and enables, in subsequent electroplating, the excellent-quality properties of the electroplated contact. As may be seen in FIG. 1b, the first conductive layer may fully cover the entire surface of the opening 110 as well as a main surface of substrate 100.

Figure 1C:
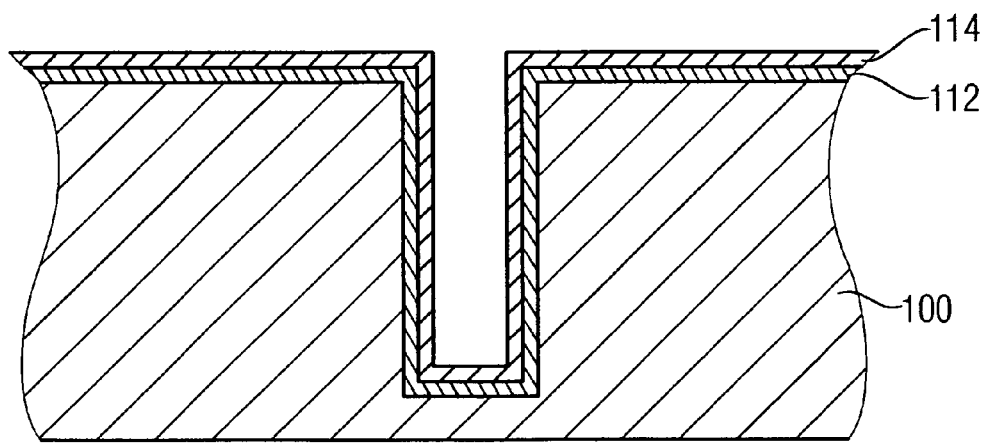

In a subsequent step, a seed layer 114 is deposited on the first conductive layer 112, see FIG. 1c. In the subsequent electroplating, seed layer 114 serves as a starting layer which enables the deposition of the contact material from the electrolyte, so that the layer deposited exhibits good mechanical anchoring. Preferably, the seed layer therefore comprises the same material as the material electroplated from the electrolyte. Here, copper is particularly preferred, since copper-based electroplating is already known in the prior art.

Seed layer 114 may also include a multiple-layer structure, an outer layer serving as the starting layer for electroplating, whereas one or several layers of the multi-layer structure may include a barrier material, preferably a metallic barrier material. When using a copper starting layer, a barrier material which is particularly Well suited is a stack of TaN/Ta or Ta/TaN. A particular advantage of the present invention is that the first conductive layer 112 serves as the conducting layer in electroplating, so that the seed layer 114 does not need to meet any requirements with regard to an electric current conduction. In particular, seed layer 114 may be configured to be very small, down to a thickness of only several layers of atoms.

Figure 1D:
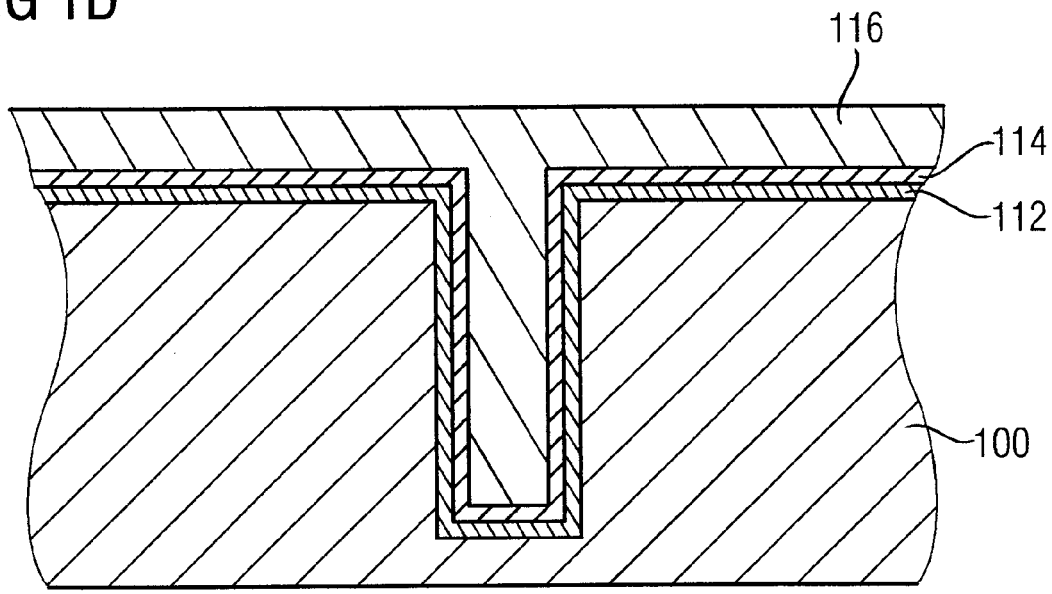

FIG. 1d shows the structure formed in FIG. 1c after performing the electroplating. Here, a contact structure 116 is formed on the seed layer 114 by electroplating, which contact structure extends, in this embodiment, both in the opening 110 and on the upper main surface of substrate 100.

The inventive method is particularly suited for fully filling via holes which, in particular, have a high aspect ratio.

The inventive method thus enables the production of vertically arranged contact structures which may have a diameter of 5 µm to 50 µm and extend, in the vertical direction, to a depth of 20 µm to 200 µm. Therefore, the method described is particularly suited with regard to the requirements placed by the semiconductor industry with regard to the production of vias in silicon wafers, which are thinned to a thickness of 20 to 200 µm.

As an alternative to the above-described production of the contact both in the opening and on the main surface, masked electroplating may also be used, so that the contact is produced only in predetermined areas, i.e., for example, in the opening 110. After the contact structure 116 has been produced on the structured surface 100a, a planarization may be performed.

Figure 2B:
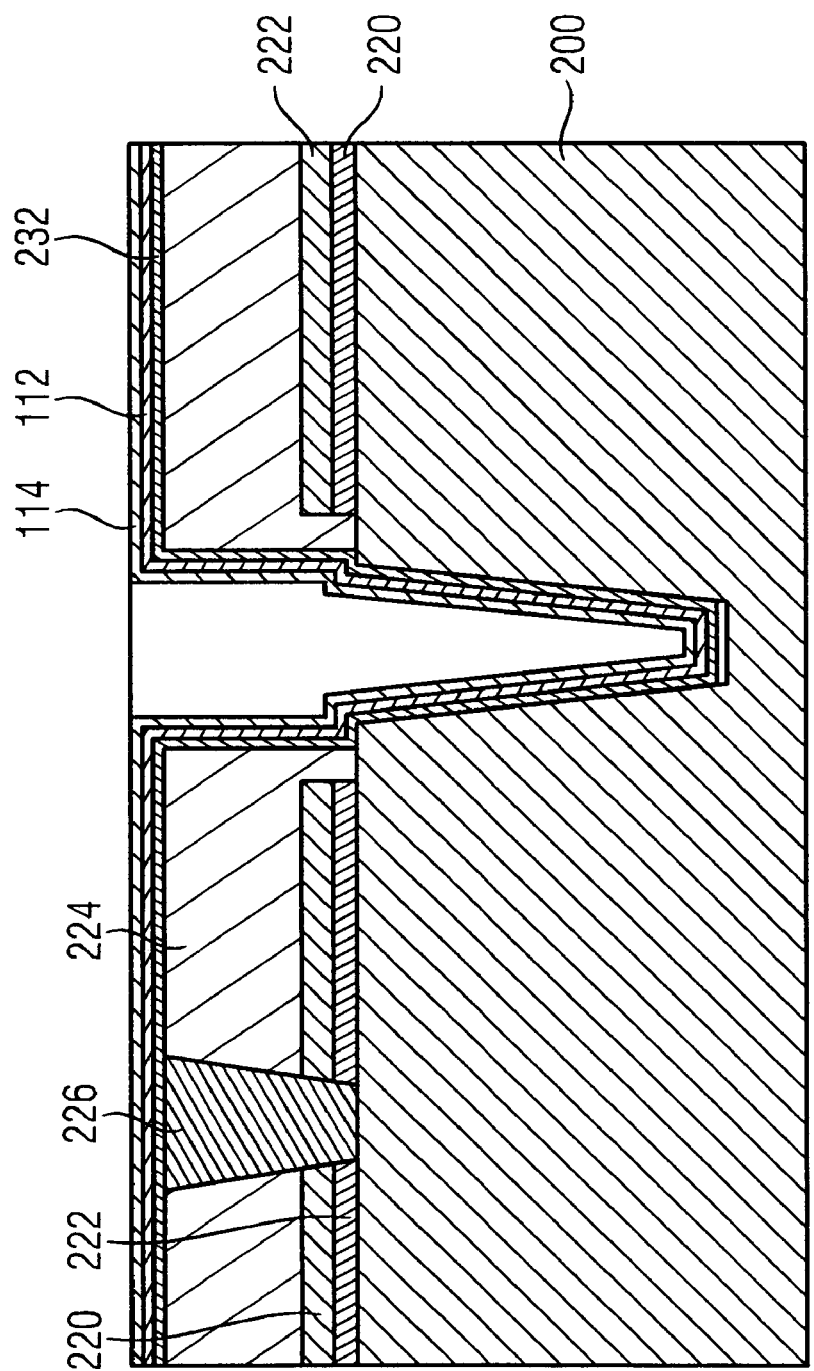

With reference to FIG. 2a–d, a preferred embodiment for performing a planarization will be described below. FIG. 2a depicts a substrate 200 comprising a via hole 210. Functional layers 220 and 222, which, for example, may include doped semiconductor layers of active or passive semiconductor components or semiconductor circuits, are formed on a main surface of substrate 200. The functional layers 220 and 222 have an insulating layer 224 formed thereon, wherein an electrical contact 226, which serves to connect the functional layers, extends in the vertical direction. For producing the via hole 210 as well as an opening 230 in the insulating layer 224, a mask layer 228, which may include, for example, a hard mask, is formed on the insulating layer 224. The mask layer 228 is opened in predetermined areas, so that the via holes 210 and the opening 230 may be produced in the insulating layer 224 by removing material, for example by etching.

Subsequently, the first conductive layer, which comprises tungsten, and the seed layer are produced, as is described With reference to FIG. 1a–d. In this embodiment, however, an insulating layer 232 is initially formed as a substrate insulation, upon which subsequently a Ti/TiN barrier, a W-CVD barrier, a TaN/Ta barrier and the Cu starting layer are produced. In other words, the first conductive layer 112 comprises, in this embodiment, the Ti/TiN barrier and the W-CVD layer, whereas seed layer 114 includes the TaN/Ta barrier and the Cu starting layer. The insulating layer 232 may be exposed in the area of the electric contact 226 to achieve electrical contact with same via the layer stack.

Subsequently, the contact structure 116 is produced by means of the above-described electroplating. In this embodiment, copper is electroplated, so that the contact structure 116 is formed of copper. After filling up the substrate openings by means of electrolytic depositions, the material of the contact structure 116 which is not required is removed from the flat surface of the substrate wafer. This will be explained below using a CMP process. Here, the CMP process, which is used in standard copper metalization, may preferably also be used for this embodiment, too. For the filling of the substrate vias, the contact structure 116 deposited includes a very thick layer, depending on the filling process. These very thick layers may influence the polishing properties in the CMF process in a clearly adverse manner. In the process, the layer stack produced is advantageously used as the stop layer. Due to the advantageous use as the polishing stop, underlying layers stemming from previous manufacturing steps are protected against uncontrolled polishing. The stack layer Ti/TiN/W or remainders thereof may be removed by further processes integrated into manufacturing, in a manner which is selective with regard to the lower insulating layer 224, which is an oxide layer, for example. Here, additional auxiliary layers, such as silicon nitride, may be dispensed with. Likewise, expensive masked electroplating is not required. Even though in this embodiment, the stack of barrier layers represents the polishing stop, a selective front-side removal of the contact structure 116 may be achieved, in other embodiments, in that the first conductive layer 112, which comprises a layer of tungsten, represents a stop layer.

Figure 2C:
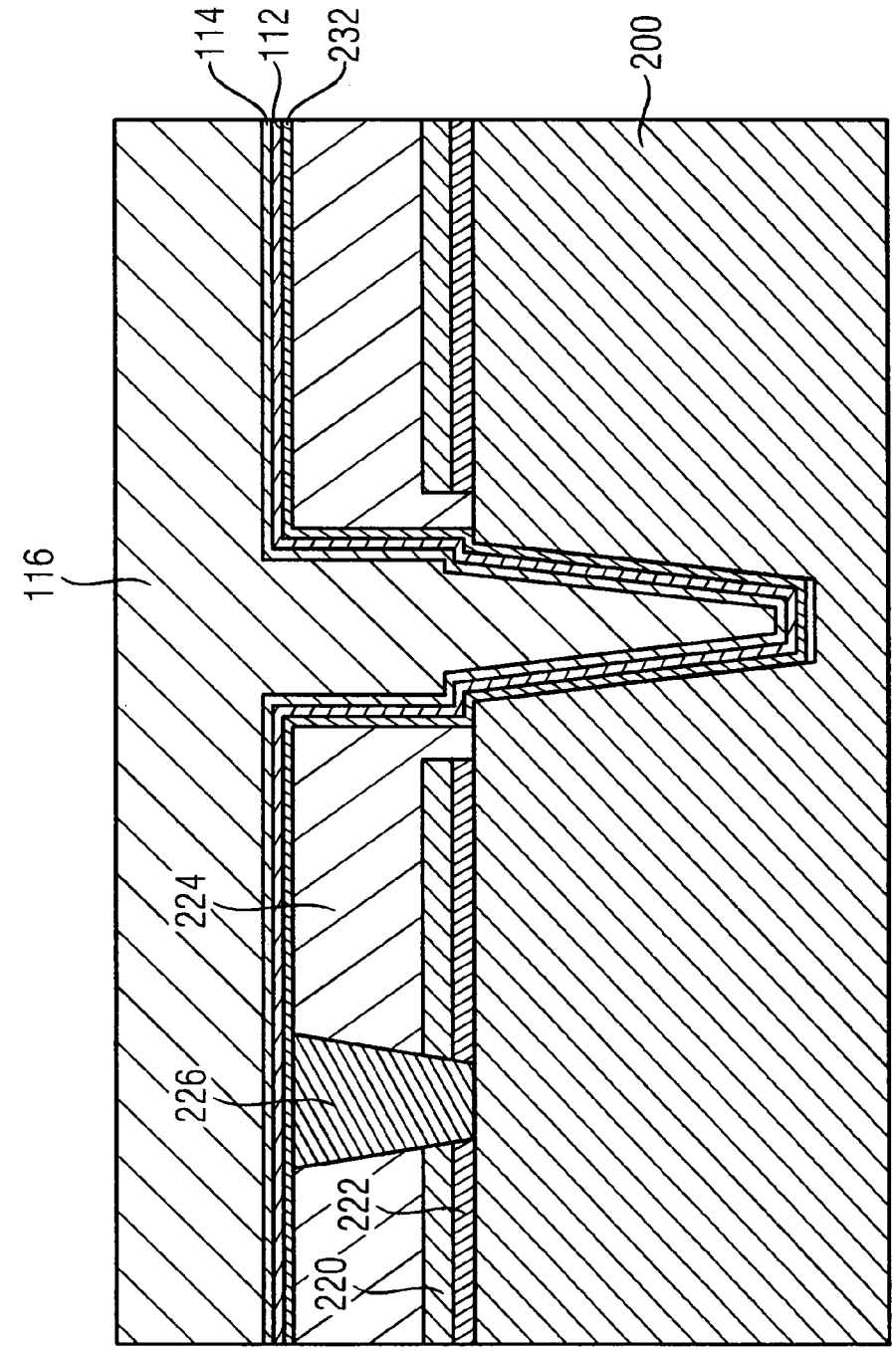
Figure 2D:
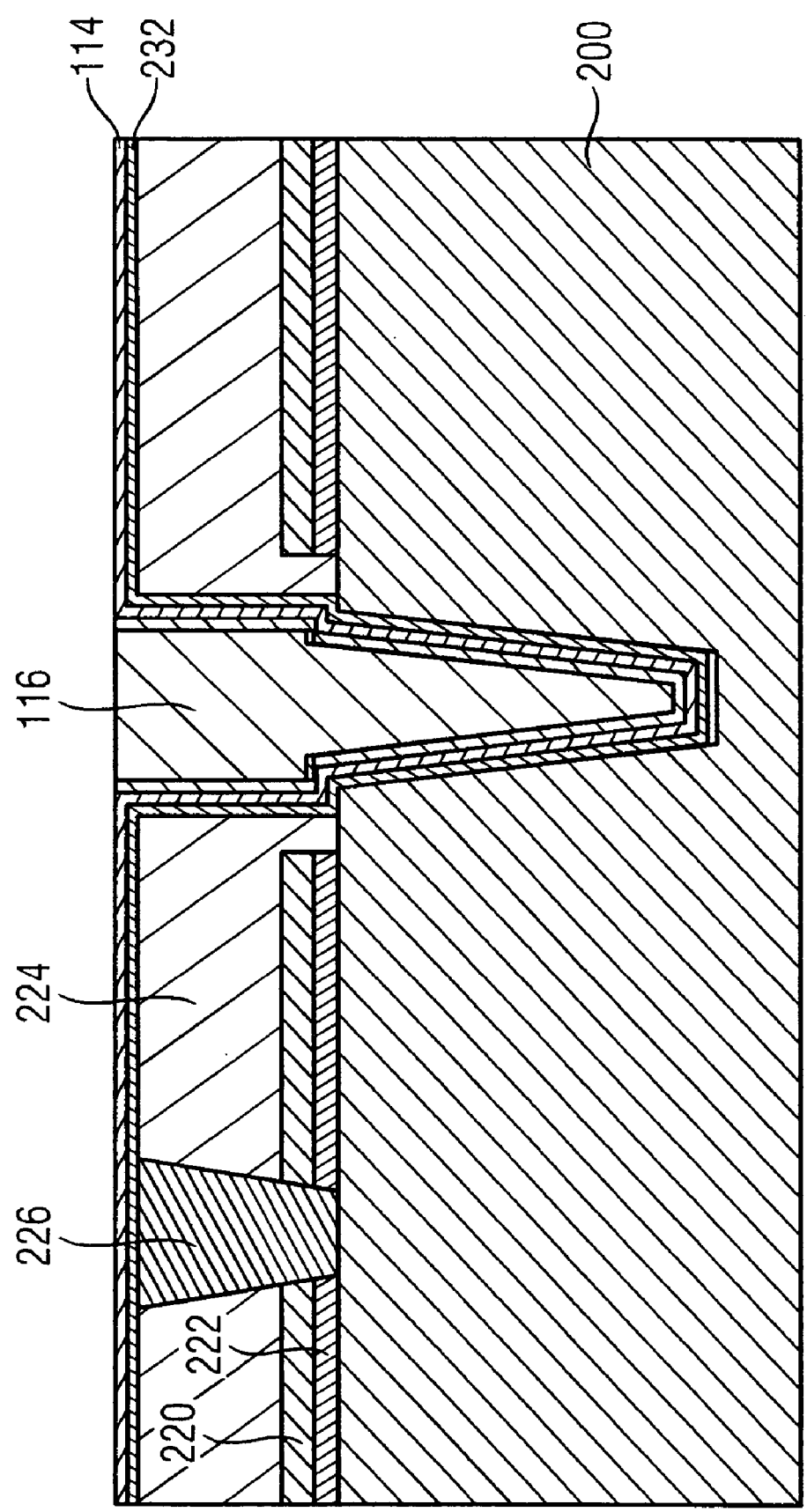

FIG. 2d shows the structure depicted in FIG. 2c once the above-described planarization has been performed. As may be seen, a consistently flat surface may be achieved with the above-described method, so that the first conductive layer 112 in the area outside the opening 230 is produced to be flat with the contact structure 116 in the area of the opening 230.

With reference to FIG. 3a–e, a further embodiment of the present invention will be described below, wherein a via is produced from a front-side main surface of a substrate to a reverse-side main surface of a substrate.

With reference to FIG. 3a, a via hole 310 is formed in a substrate 300, on which via hole 310 the first conductive layer 112 and the seed layer 114 are formed in accordance with the above-described embodiment. As has already been described above, the contact structure 116 is exposed and flat with a front side 302 of substrate 300. Via hole 310 may extend, for example, in the vertical direction, for 100 µm into substrate 300. After the completion of the semiconductor product, substrate 300 is grinded to be thin from the reverse-side. FIG. 3b shows the structure depicted in FIG. 3a once the reverse-side removal has been performed, wherein the substrate is thinned to a thickness of about 110 µm. In general, the grinding is preferably performed to stop at a thickness such that the first conductive layer at the bottom of the via is separated from the grinded reverse side surface of the substrate by a distance of 10 µm. Subsequently, wet chemical "damage etching" is performed, which results in a further removal from the substrate, preferably about 20 µm. In this damage etching, the substrate vias are exposed from the reverse side. The tungsten and/or the barrier layers may act as an etch stop against the etch chemicals of the damage etching in this embodiment. Therefore, this method does not necessarily require an additional etch-stop layer.

As can be seen in FIG. 3c, the metalized substrate via partly projects out from the reverse-side surface of the substrate 300 as a so-called pin, the surface having been formed by ablating substrate 300. Subsequently, a standard planarization may be performed by means of a chemical-mechanical polishing step. In this embodiment, the via hole is galvanically filled up with Cu, which has the advantage that the W layer as well as the copper filling may be removed at about the same rate. The process stops on the flat surface of the substrate, undercuts in etching occurring neither in the tungsten material nor in the copper material. Thus, the above-described method enables, in a simple manner, the chemical-mechanical polishing step to be performed only over a small depth, so that a high quality of the planarized surface with minor contaminations of the contact may be achieved.

Figure 3D:
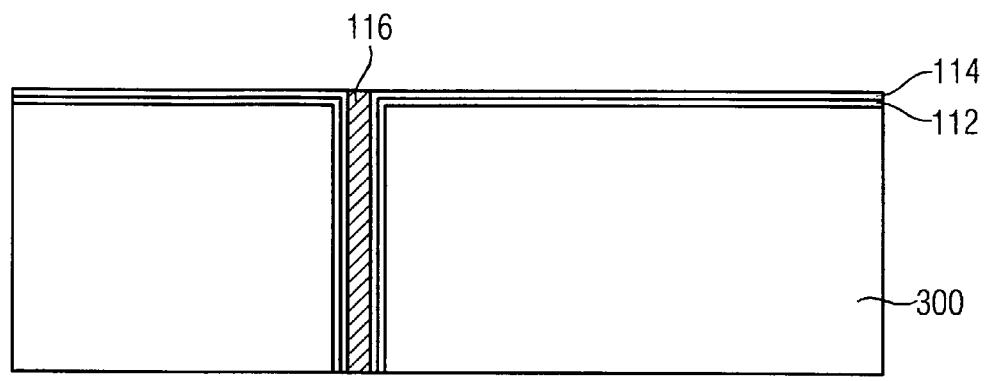
Figure 3E:
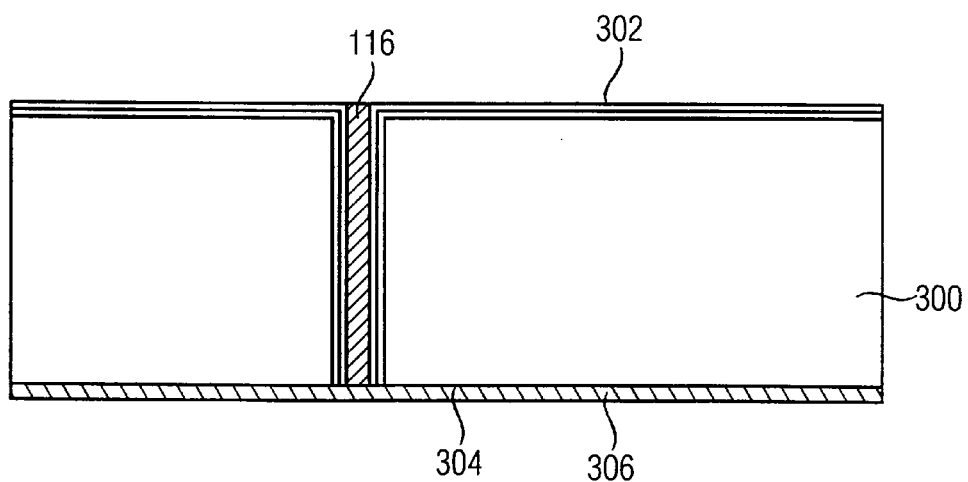

In order to electrically connect the reverse-side contacts which have been polished to be flat, or plane, a metalization is deposited in a subsequent step. To produce an RF ground connection it is only required to produce a layer, the whole area of which is deposited in a homogeneous manner Since the contact areas lie absolutely flat in the surface due to the method described, no contact problems whatsoever, which may be associated with a lack in coverage of steps, will arise. FIG. 3e shows the structure in accordance with FIG. 3d after the above-described metalization has been performed. As may be seen, the metalization 306 extends, on the reverse-side 304 of substrate 300, as a metallic layer across the area of the contact structure 116, whereby same is electrically connected to the metalization 306.

The metalization 306 may comprise, as a contact material, metals or compounds which react only to a limited extent with copper, such as Ti, Cr, W, Ta, TiW, TiN, TaN. These may be combined, in addition, with further metals which comprise a good conductivity or are solderable, depending on the further processing envisioned. In particular, contact bumps may be provided for forming three-dimensional stacks so as to achieve an electrical contact between different substrates of a three-dimensional stack. Even though it has been described, in the above embodiment, that the depth of the substrate via is 100 μm, it may be clearly less or clearly more than 100 μm in other embodiments. In addition, the width and/or the diameter of a substrate via may preferably be 10 μm, whereas they may be clearly less or clearly more than 10 μm in other embodiments.

What is claimed is:

1. Method for producing a contact structure on a structured surface of a substrate, the method comprising:
   producing a first conductive layer on the structured surface, the first conductive layer comprising tungsten;
   producing a conductive seed layer on the first conductive layer, the seed layer comprising a multiple-layer structure, wherein the first conductive layer is not part of the multiple-layer structure;
   electroplating the contact structure on the seed layer; and
   selectively removing the contact structure, at least one of the layers of the multiple-layer structure of the seed layer acting as a stop layer in the selective removal.

2. Method as claimed in claim 1, wherein at least a sublayer of the first conductive layer is produced by means of CVD deposition.

3. Method as claimed in claim 1, wherein the substrate includes a semiconductor substrate.

4. Method as claimed in claim 3, wherein the semiconductor substrate is a silicon substrate.

5. Method as claimed in claim 1, wherein the structured surface is a surface of an opening in the substrate.

6. Method as claimed in claim 5, wherein the opening at least in one direction comprises an aspect ratio of greater than or equal to 1:4.

7. Method as claimed in claim 5, wherein the opening extends into the substrate in the vertical direction at a depth of greater than or equal to 20 pm.

8. Method as claimed in claim 1, wherein the seed layer comprises a multiple-layer structure, one or several layers of the multiple-layer structure comprising a metallic barrier material.

9. Method as claimed in claim 8, wherein the multiple-layer structure of the seed layer includes a stack comprising barrier metals.

10. Method as claimed in claim 9, wherein the barrier metals are selected from the group comprising Ta, TaN, Ti, TiN and TiW.

11. Method as claimed in claim 1, which further includes selectively removing the contact structure, the first conductive layer acting as a stop layer in the selective removal.

12. Method as claimed in claim 1, wherein the first conductive layer comprises a multiple-layer structure.

13. Method as claimed in claim 12, wherein the multiple-layer structure of the first conductive layer includes one or multiple metallic barrier layers.

14. Method as claimed in claim 12 or 13, wherein the multiple-layer structure includes at least one insulating layer.

15. Method as claimed in claim 1, wherein the first conductive layer comprises at least one layer which consists only of tungsten or tungsten alloy.

16. Method as claimed in claim 1, which further includes the step of selectively removing material from the reverse side of the substrate, the first conductive layer representing a stop layer in the selective removal.

17. Method as claimed in claim 1, wherein the first conductive layer comprises a multiple-layer structure, at least one of the layers of the multiple-layer structure representing a stop layer for the selective removal of the material of the substrate.

18. Method as claimed in claim 16, wherein the selective removal includes wet chemical etching.

19. Method as claimed in claim 1, wherein the structured surface is a surface of a via hole which extends to a reverse side of the substrate in the vertical direction from a front side of the substrate, the method further including the step of a reverse-side removal of material of the substrate.

20. Method as claimed in claim 19, wherein the reverse-side removal of material of the substrate includes etching, wherein the first conductive layer represents a stop layer.

21. Method as claimed in claim 20, wherein, after the selective removal of the material of the substrate, chemical-mechanical polishing is performed, whereby the contact structure is exposed on the reverse side, and a via structure is formed.

22. Method as claimed in claim 21, wherein a conductive connecting layer is deposited on the whole area of the reverse side of the substrate after the reverse side of the contact structure has been exposed.

23. Method as claimed in claim 21 wherein bumps are formed on the reverse side for electrically connecting the contact structure.

* * * * *